United States Patent
Simonsson et al.

(10) Patent No.: US 7,338,332 B2
(45) Date of Patent: Mar. 4, 2008

(54) FLEXIBLE CIRCUIT TO BOARD CONNECTOR

(75) Inventors: Olof Simon Simonsson, Dalby (SE); Omid Kazemifar, Staffanstorp (SE); Mikael Pär-Oskar Häll, Malmö (SE); Maiko Anneli Karlsson, Malmö (SE); Håkan Klas Petersson, Lund (SE)

(73) Assignee: Sony Ericsson Mobile Communications AB, Lund (SE)

( * ) Notice: Subject to any disclaimer, the term of this patent is extended or adjusted under 35 U.S.C. 154(b) by 0 days.

(21) Appl. No.: 11/433,571

(22) Filed: May 15, 2006

(65) Prior Publication Data
US 2007/0264879 A1    Nov. 15, 2007

(51) Int. Cl.
*H01R 4/48* (2006.01)

(52) U.S. Cl. .................. 439/729; 439/61; 439/495

(58) Field of Classification Search ............... 439/729, 439/61, 495
See application file for complete search history.

(56) References Cited

U.S. PATENT DOCUMENTS

| | | | |
|---|---|---|---|
| 3,602,870 A | 8/1971 | Willard | |
| 3,629,787 A * | 12/1971 | Wilson | 439/67 |
| 4,019,798 A * | 4/1977 | Zielinski | 439/67 |
| 4,054,348 A | 10/1977 | Stroupe et al. | |
| 4,060,889 A | 12/1977 | Zielinski | |
| 4,111,510 A * | 9/1978 | Zurcher | 439/67 |
| 4,220,382 A * | 9/1980 | Ritchie et al. | 439/61 |
| 4,289,364 A * | 9/1981 | Strom et al. | 439/67 |
| 4,416,497 A | 11/1983 | Brandsness et al. | |
| 4,824,391 A * | 4/1989 | Ii | 439/329 |
| 4,969,835 A * | 11/1990 | Kobayashi et al. | 439/161 |
| 5,195,897 A | 3/1993 | Kent et al. | |
| 5,209,671 A * | 5/1993 | Sugimoto et al. | 439/67 |
| 5,529,502 A * | 6/1996 | Peltier et al. | 439/67 |

FOREIGN PATENT DOCUMENTS

| | | |
|---|---|---|
| EP | 0 908 968 A2 | 4/1999 |
| FR | 2 508 720 | 12/1982 |
| JP | 2001313106 A * | 9/2001 |

OTHER PUBLICATIONS

International Search Report for corresponding PCT application; dated May 21, 2007; 4 pages.

* cited by examiner

*Primary Examiner*—Truc Nguyen
(74) *Attorney, Agent, or Firm*—Harrity Snyder, LLP

(57) ABSTRACT

A system includes a rigid electrical device including a first contact, and a flexible electrical device including a second contact. The system further includes a spring clip connecting the first contact to the second contact to electrically interconnect the rigid electrical device to the flexible electrical device.

12 Claims, 6 Drawing Sheets

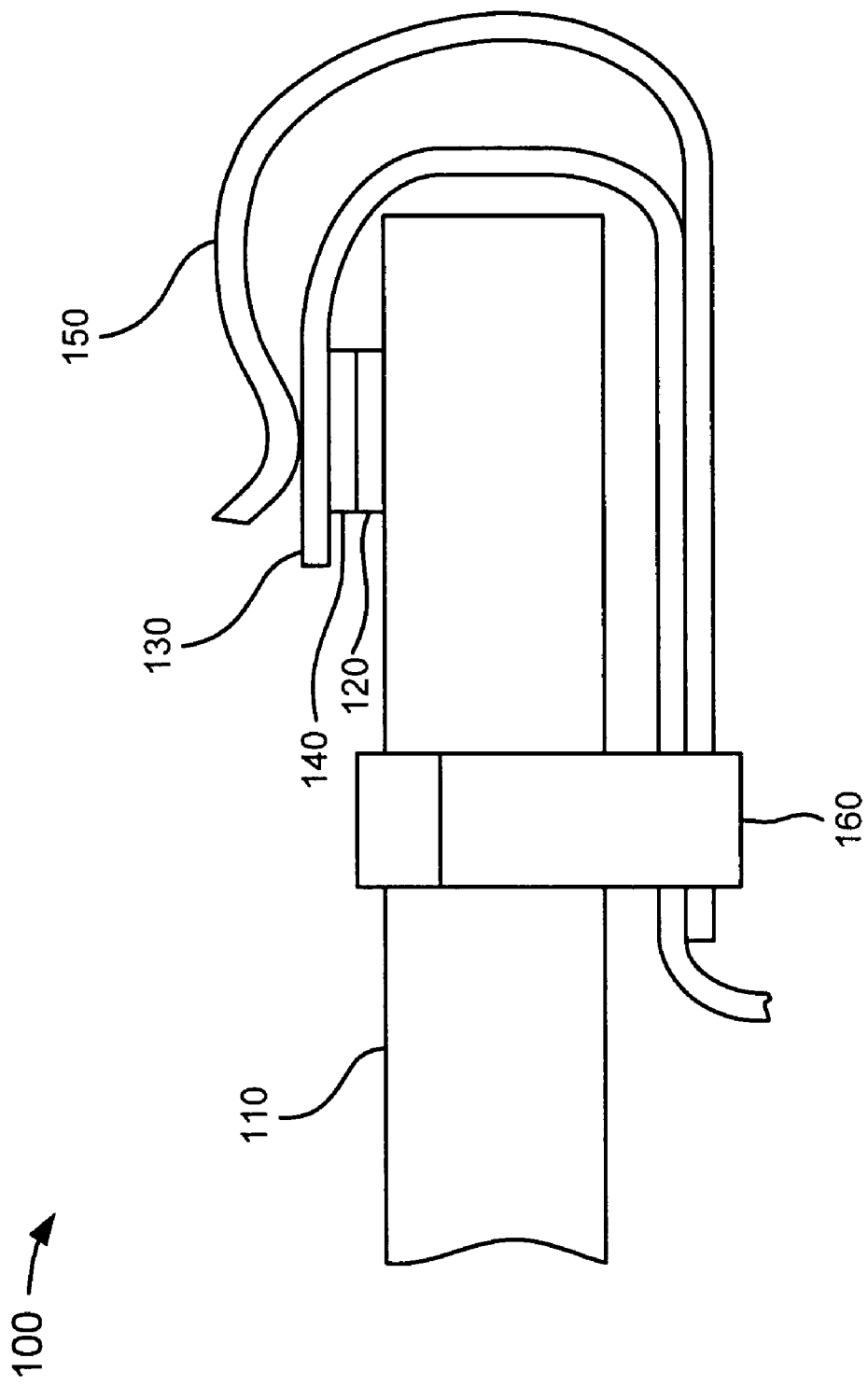

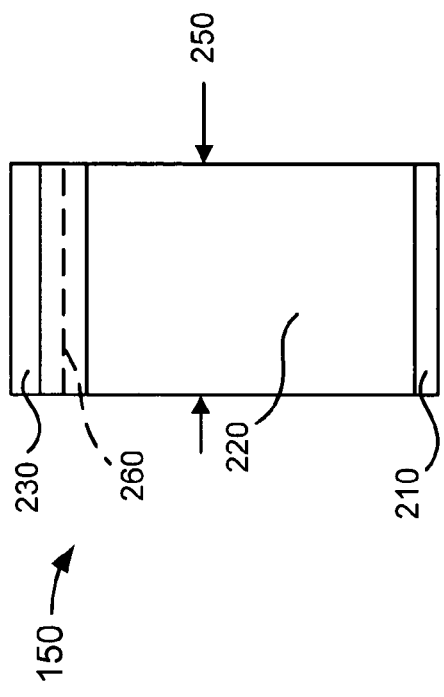
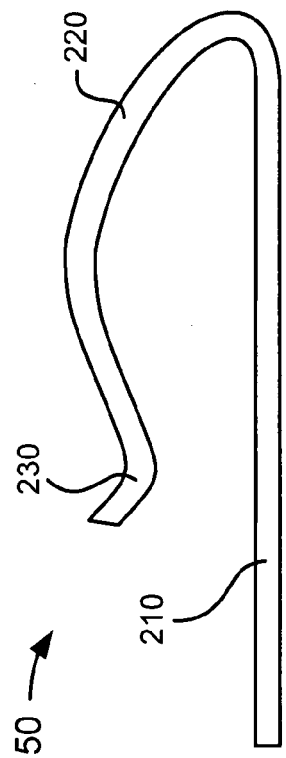
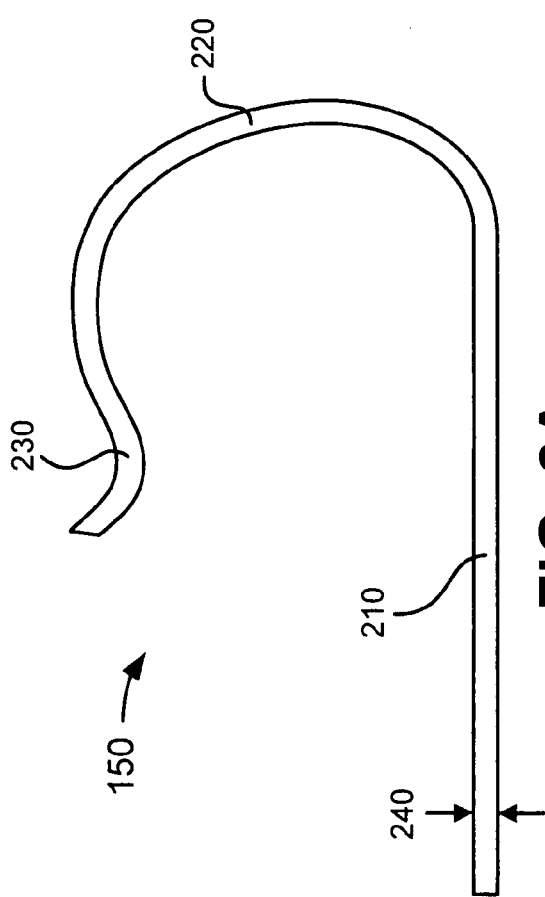
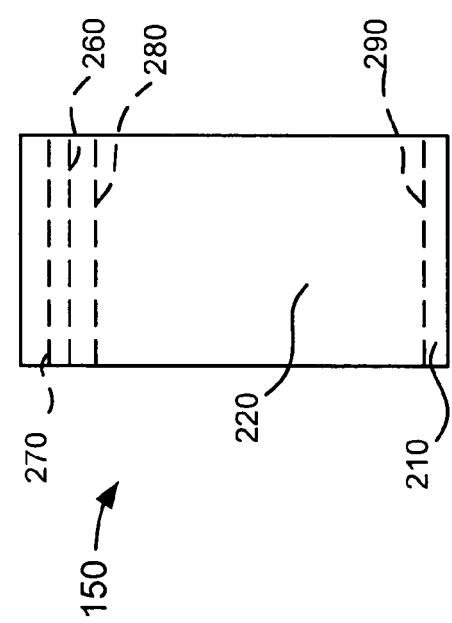
FIG. 2A
FIG. 2B
FIG. 2C
FIG. 2D

FLEXIBLE CIRCUIT TO BOARD CONNECTOR

BACKGROUND

1. Field of the Invention

Implementations described herein relate generally to devices and, more particularly, to a flexible circuit to board connector.

2. Description of Related Art

Printed circuit boards (PCBs) (which may be referred to as printing wiring boards (PWBs) or etched wiring board assemblies) may be used in computers, communications devices (e.g., pagers, personal digital assistants (PDAs), telephones, etc.), televisions, cameras, and/or many other devices. In a typical PCB, many electrical components may be attached to the top and/or bottom surfaces of the PCB. PCBs may be used to mechanically support and electrically connect the many electrical components using conductive pathways, or traces, which may be etched from copper sheets laminated onto a non-conductive substrate.

Flexible circuits (which may be referred to as flexible printed circuits (FPCs)) may also be used in the devices described above in connection with PCBs. Flexible circuits may be formed by depositing electrical components on flexible substrates (e.g., thin, flexible plastic or metal foil substrates). In the simplest case, a flexible circuit may be made using the same or similar electrical components used for rigid PCBs, but the substrate may be made flexible instead of rigid. Flexible circuits may be used as connectors in devices where flexibility, space savings, or production constraints limit the serviceability of rigid PCBs. Flexible circuits may be ideal for highly compact products because they may be shaped as desired. Flexible circuits may be effective in preventing incorrect wiring and may reduce wiring costs.

Many devices may incorporate a combination of PCBs and/or flexible circuits. A flexible circuit may interconnect with a PCB(s) in such devices. Electrical interconnects may be used in the majority of all electronic packages, and usually more than once. Electrical interconnects may have the greatest single impact on the ease of assembly and disassembly of an electronic device. For example, the need to produce several million units of a given cellular product (e.g., cellular phone) design per year may necessitate cost-effective and reliable solutions for electrical interconnects.

Currently, PCBs may electrically interconnect to flexible circuits using low insertion force (LIF) or zero insertion force (ZIF) connectors. However, pressure may deform the securing arms of the electrical contacts of a ZIF connector, and/or may displace the electrical contacts. When this happens, the ZIF connector may not provide reliable electrical connection between the flexible circuit and the PCB.

PCBs may also electrically interconnect to flexible circuits using surface mount, pin board to board (BTB) connectors. While BTB connectors may offer certain benefits, they are very unforgiving of tolerance, especially in the (XY) plane of a PCB.

Another type of electrical interconnect may be a ball grid array (BGA). In a BGA, balls of solder may cover (or partially cover) a portion of a PCB in a grid pattern. A flexible circuit may include contacts or pads arranged to match the grid pattern of the BGA. The arrangement may be heated, causing the solder balls to melt. Surface tension may cause the molten solder to hold the PCB in alignment with the flexible circuit, while the solder cools and solidifies. Unfortunately, the solder balls in BGAs may not flex sufficiently, so that bending and thermal expansion of the PCB may be transmitted directly to the flexible circuit. This may cause solder joints to fracture under high thermal or mechanical stress. Another disadvantage of BGAs may be the difficulty in locating soldering faults once soldering is complete.

A further type of electrical interconnect may be a pin grid array (PGA). A PGA may be similar to a BGA, but pins (instead of balls of solder) may cover (or partially cover) a portion of a PCB in a grid pattern. The pins may be used to conduct electrical signals from a circuit (e.g., a flexible circuit) to a PCB to which the circuit may be connected, e.g., via soldering. PGAs may be produced with more and more pins, and with decreasing spacing between the pins, which may cause difficulties for the soldering process. As the pins get closer together, the danger of accidentally bridging adjacent pins with solder may grow.

Another significant disadvantage of LIF, ZIF, and BTB connectors, and BGA and PGA soldering is that such electrical interconnects may be expensive. This may be a distinct disadvantage in today's world of high volume, low cost electrical devices.

SUMMARY

According to one aspect, a system may include a rigid electrical device including a first contact, a flexible electrical device including a second contact, and a spring clip connecting the first contact to the second contact to electrically interconnect the rigid electrical device to the flexible electrical device.

Additionally, the system may further comprise a guide for receiving a portion of the spring clip.

Additionally, the guide may support the portion of the spring clip and prevent lateral movement of the portion of the spring clip.

Additionally, the guide may comprise a base portion integrally connecting a first side portion and a second side portion.

Additionally, a distal end of one of the first or second side portions may include a hook for connecting the guide to the rigid electrical device.

Additionally, the rigid electrical device may comprise a printed circuit board.

Additionally, the flexible electrical device may comprise a flexible circuit.

Additionally, the spring clip may comprise a flex portion integrally connecting a base portion to an engagement portion.

Additionally, the system may further comprise a guide for receiving the base portion of the spring clip.

Additionally, the engagement portion may provide a force to connect the first contact to the second contact.

Additionally, the flex portion may flex to open the spring clip for receiving the rigid electrical device and the flexible electrical device.

According to another aspect, a device may include a printed circuit board including a first contact, a flexible circuit including a second contact, and a spring clip. The spring clip may have a flex portion integrally connecting a base portion to an engagement portion. The flex portion of the spring clip may impart a force to the engagement portion to cause the engagement portion to impart a force connecting the first contact to the second contact and electrically interconnect the printed circuit board to the flexible circuit. The device may further include a guide for receiving the base portion of the spring clip.

According to yet another aspect, a system may include means for providing a rigid support for at least a first contact, and means for providing a flexible support for at least a second contact. The system may also include means for providing a spring force connecting the first contact to the second contact to electrically interconnect the rigid support to the flexible support.

According to a further aspect, a method may include folding a flexible electrical device around an edge of a rigid electrical device, and aligning a flexible electrical device contact with a rigid electrical device contact. The method may also include connecting the flexible electrical device contact to the rigid electrical device contact with a spring clip to electrically interconnect the rigid electrical device to the flexible electrical device.

Additionally, the method may further comprise moving the spring clip toward the flexible electrical device and the rigid electrical device to force the flexible electrical device contact into connection with the rigid electrical device contact.

Additionally, the method may further comprise providing a portion of the spring clip in a guide, and preventing lateral movement of the portion of the spring clip with the guide.

According to still another aspect, a method may include folding a flexible circuit around an edge of a printed circuit board, and aligning a flexible circuit contact with a printed circuit board contact. The method may also include connecting the flexible circuit contact to the printed circuit board contact with a spring clip to electrically interconnect the flexible circuit to the printed circuit board.

According to still yet another aspect, a method may include moving a spring clip away from a flexible electrical device folded around an edge of a rigid electrical device, and disconnecting a flexible electrical device contact from a printed circuit board contact by releasing a force exerted by the spring clip on the contacts. The method may also include unfolding the flexible electrical device from the edge of the rigid electrical device.

According to a further aspect, a system may include a first flexible electrical device including a first contact, a second flexible electrical device including a second contact, and a spring clip connecting the first contact to the second contact to electrically interconnect the first flexible electrical device to the second flexible electrical device.

According to still a further aspect, a system may include a first rigid electrical device including a first contact, a second rigid electrical device including a second contact, and a spring clip connecting the first contact to the second contact to electrically interconnect the first rigid electrical device to the second rigid electrical device.

BRIEF DESCRIPTION OF THE DRAWINGS

The accompanying drawings, which are incorporated in and constitute a part of this specification, illustrate an embodiment of the invention and, together with the description, explain the invention. In the drawings:

FIG. 1 is a partial side elevational view of an exemplary system for electrically interconnecting a flexible circuit to a printed circuit board via a spring clip and a guide according to an implementation consistent with principles of the invention;

FIG. 2A is a side elevational view of the exemplary spring clip of FIG. 1 according to an implementation consistent with principles of the invention;

FIG. 2B is a front elevational view of the exemplary spring clip of FIGS. 1 and 2A;

FIG. 2C is a rear elevational view of the exemplary spring clip of FIGS. 1, 2A, and 2B;

FIG. 2D is a side elevational view of the exemplary spring clip of FIGS. 1 and 2A-2C, in an closed position;

DETAILED DESCRIPTION

Figure 3B:
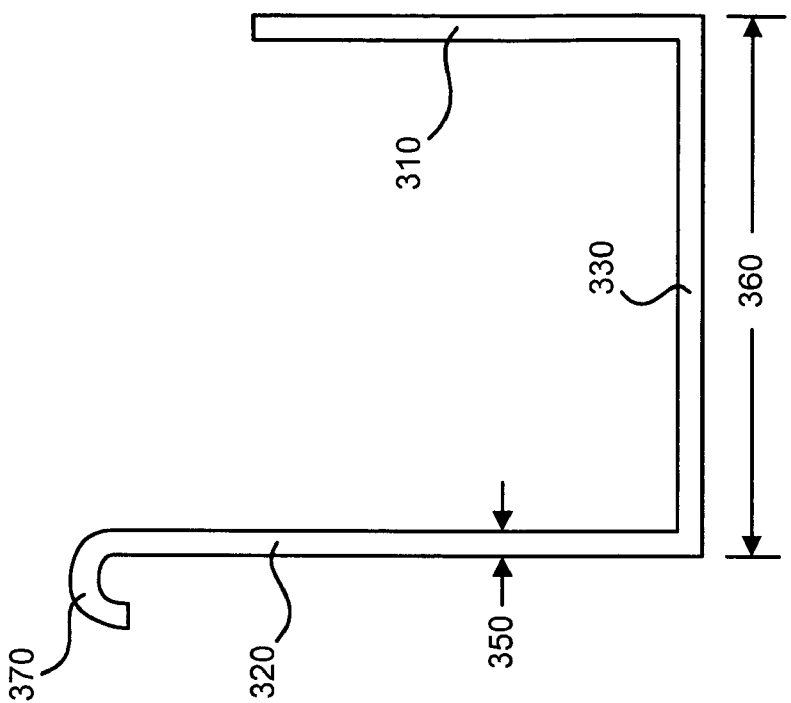
FIG. 3B is a front elevational view of the exemplary guide of FIGS. 1 and 3A.

The following detailed description of the invention refers to the accompanying drawings. The same reference numbers in different drawings may identify the same or similar elements. Also, the following detailed description does not limit the invention.

Implementations consistent with principles of the invention may relate to systems and methods for electrically interconnecting a flexible circuit to a PCB which may be provided in a device. The systems and methods may provide a quick, easy, and cost-effective way to electrically interconnect the flexible circuit to the PCB. In case of device repair and/or modification, the systems and methods may provide an easy way to disconnect the flexible circuit from the PCB.

The description to follow will describe a device. As used herein, a "device" may include a radiotelephone; a personal communications system (PCS) terminal that may combine a cellular radiotelephone with data processing, a facsimile, and data communications capabilities; a personal digital assistant (PDA) that can include a radiotelephone, pager, Internet/intranet access, web browser, organizer, calendar, a Doppler receiver, and/or global positioning system (GPS) receiver; a laptop; a GPS device; a personal computer; a television; an MP3 player (e.g., an iPod); a printer; a facsimile machine; a pager; and any other device capable of utilizing a flexible circuit and a PCB.

FIG. 1 is an exemplary diagram illustrating concepts consistent with principles of the invention. As shown in FIG. 1, an interconnection system 100 of a device may include a printed circuit board (PCB) 110 that may have a variety of electrical components (e.g., a contact or pad 120), and a flexible circuit 130 that may have a variety of electrical components (e.g., a contact or pad 140). Interconnection system 100 may include a spring clip 150 that may exert a restraining force on flexible circuit 130 to electrically interconnect contact 140 of flexible circuit 130 to contact 120 of PCB 110. A guide 160 may be provided to prevent a distal end of spring clip 150 from rotating and/or laterally moving.

Guide 160 may support spring clip 150 and flexible circuit 130 to provide a compact package for the device.

PCB 110 may be a variety of sizes and shapes depending upon its use in the device, and/or the size of the device. For example in one implementation, PCB 110 may be smaller in size if it is provided in a cellular phone, than if it is provided in a big screen television. PCB 110 may be made from a variety of materials, including any of the materials used to make existing PCBs. For example in one implementation, PCB 110 may include conductive pathways, or traces, which may be etched from copper sheets laminated onto a non-conductive substrate. PCB 110 may include a variety of electrical components depending upon its use in the device. For example, PCB 110 may include contacts, traces, capacitors, resistors, inductors, varistors, diodes, transistors, oscillators, resonators, relays, etc. Although FIG. 1 shows what is termed a "printed circuit board," in one implementation consistent with principles of the invention, PCB 110 may be replaced with any rigid electronics based substrate (i.e., a rigid electrical device), e.g., rigid-flex circuits, semiconductor packages, multichip modules, micro electro mechanical systems (MEMS), ceramic circuits, etc.

Flexible circuit 130 may be a variety of sizes and shapes depending upon its use in the device, and/or the size of the device. For example in one implementation, flexible circuit 130 may be smaller in size if it is provided in a cellular phone, than if it is provided in a big screen television. Flexible circuit 130 may be made from a variety of materials, including any of the materials used to make existing flexible circuits. For example in one implementation, flexible circuit 130 may be formed by depositing electrical components on flexible substrates (e.g., thin, flexible plastic or metal foil substrates). Flexible circuit 130 may include a variety of electrical components depending upon its use in the device. For example, flexible circuit 130 may include the same or similar electrical components used for PCBs, as described above (e.g., contacts, traces, capacitors, resistors, inductors, varistors, diodes, transistors, oscillators, resonators, relays, etc.). Flexible circuit 130 may be a single-sided flexible circuit, a double-sided flexible circuit, a multilayer flexible circuit, a rigid flexible circuit, and/or other similar circuits. Although FIG. 1 shows what is termed a "flexible circuit," in one implementation consistent with principles of the invention, flexible circuit 130 may be replaced with any flexible substrate capable of containing electrical components (i.e., a flexible electrical device), and/or any type of flexible electronics, e.g., a ribbon cable.

Exemplary Spring Clips

FIG. 2A is a side elevational view of the exemplary spring clip 150 of FIG. 1 in its "open" or flexed position. As shown in FIG. 2A, spring clip 150 may include a base portion 210, which may be integrally connected to a flex portion 220 and an engagement portion 230. To place spring clip 150 in the "open" position shown in FIG. 2A, a force (via, e.g., a thumb or finger) may be applied to engagement portion 230 to move engagement portion 230 away from base portion 210 and "open" spring clip 150. The force may cause flex portion 220 to flex and move upward and to the right. Spring clip 150 may be a variety of sizes and shapes depending upon the size and shape of PCB 110 and flexible circuit 130. For example in one implementation, spring clip 150 may have a thickness 240 and width 250 (as shown in FIG. 2B) that ensures that spring clip 150 provides a sufficient force and surface area to maintain the connection between contacts 120 and 140. In another implementation, width 250 of spring clip 150 may be made equal to thickness 240 so that spring clip 150 may resemble a cotter pin. Width 240 and thickness 250 of spring clip 150 may depend on the material, shape, and/or required restraining force of spring clip 150. For example, a smaller thickness and width may produce a less rigid spring clip 150 (i.e., one that provides less restraining force).

Spring clip 150 may be made from a variety of materials depending upon the required restraining force to be applied by spring clip 150, the desire to not scratch flexible circuit 130, as well as the desired shape, thickness 240, and width 250 of spring clip 150. For example in one implementation, spring clip 150 may be made from stainless steel, Inconel, thermoplastics, or other suitable spring materials. The environmental conditions of system 100 may also be a factor in the material choice of spring clip 150. For example, if system 100 is provided in an environment with excessive heat, then some materials may not be suitable for spring clip 150 due to possible melting.

Spring clip 150 may have a variety of shapes. Although FIG. 2A shows a C-shaped spring clip 150, other shapes may be utilized, e.g., U-shaped, square-shaped, etc. Other variations in the shape of spring clip 150 may include providing various taperings to the spring clip 150 to produce different restraining forces, increasing the number of contact points of spring clip 150, modifying the angle and length of flex portion 220, etc.

FIG. 2B is a front elevational view of the exemplary spring clip 150 of FIGS. 1 and 2A, and further shows a hidden line 260 for a top surface of engagement portion 230. FIG. 2C is a rear elevational view of the exemplary spring clip 150 of FIGS. 1, 2A, and 2B, and further shows a hidden line 270 for a distal end of engagement portion 230, a hidden line 280 for a bottom surface of engagement portion 230, and a hidden line 290 for a top surface of base portion 210.

FIG. 2D is a side elevational view of the exemplary spring clip 150 of FIGS. 1 and 2A-2C, in its "closed" or unflexed position. Spring clip 150 of FIG. 2D may be deemed to be in a "closed" position because flex portion 220 may be unflexed and a force may not be applied to engagement portion 230. Spring clip 150 may be "opened" (as shown in FIG. 2A) by applying a force to engagement portion 230, which, in turn, may bend flex portion 220.

Although FIGS. 1 and 2A-2D show a spring clip, other types of mechanical clips providing a spring force may be utilized in system 100. For example, spring clip 150 may be replaced with a buckle clip, a belt clip, a meter jaw, etc.

Exemplary Guides

Figure 3A:
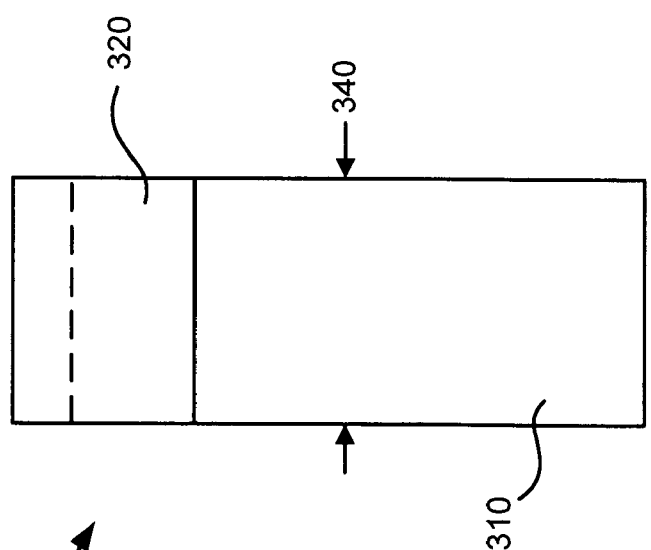
FIG. 3A is a side elevational view of the exemplary guide of FIG. 1 according to an implementation consistent with principles of the invention.

FIG. 3A is a side elevational view of the exemplary guide 160 of FIG. 1, and FIG. 3B is a front elevational view of the exemplary guide 160. As shown in FIGS. 3A and 3B, guide 160 may include a first side portion 310, a second side portion 320, and a base portion 330 which may integrally connect first side portion 310 to second side portion 320. Guide 160 may provide support for spring clip 150 and/or flexible circuit 130, and may prevent spring clip 150 from rotating about the distal end of base portion 210 and/or from moving laterally. Guide 160 may connect to PCB 110 by connecting one of first side portion 310 or second side portion 320 to PCB 110 using a variety of existing connection mechanisms, e.g., screws, glue, adhesive, solder, etc. For example, guide 160 may include a hook 370 integrally provided at the distal end of second side portion 320. Hook 370 may be used to connect guide 160 to PCB 110. For example in one implementation, hook 370 may be provided in an opening provided in PCB 110 and sized to accommodate hook 370. In another implementation, hook 370 may face in the opposite direction shown in FIG. 3B and a majority of guide 160 may be provided under PCB 110.

Although guide 160 is shown in the Figures, guide 160 may be optional if spring clip 150 provides a sufficient restraining force to maintain spring clip 150 and flexible circuit 130 connected to PCB 110.

Guide 160 may be a variety of sizes and shapes depending upon the size and shape of PCB 110 and flexible circuit 130. For example in one implementation as shown in FIG. 3B, guide 160 may be shaped like a channel, where base portion 330 of guide 160 may support flexible circuit 130 and spring clip 150, and side portions 310 and 320 may prevent lateral movement of flexible circuit 130 and spring clip 150. In another implementation, guide 160 may be L-shaped by omitting side portion 310. In still another implementation, guide 160 may have a width 340, a thickness 350, and a length 360. The size of these dimensions may depend upon the size of system 100, the material selected for guide 160, as well as the environment of system 100 (e.g., the thermal conditions).

Guide 160 may be made from a variety of materials depending upon the force applied by spring clip 150 on guide 160, as well the shape, width 340, thickness 350, and length 360 of guide 160. For example in one implementation, guide 160 may be made from stainless steel, Inconel, thermoplastics, or other suitable materials. The environmental conditions of system 100 may also be a factor in the material choice of guide 160. For example, if system 100 is provided in an environment with excessive heat, then some materials may not be suitable for guide 160 due to possible melting.

Figure 4:
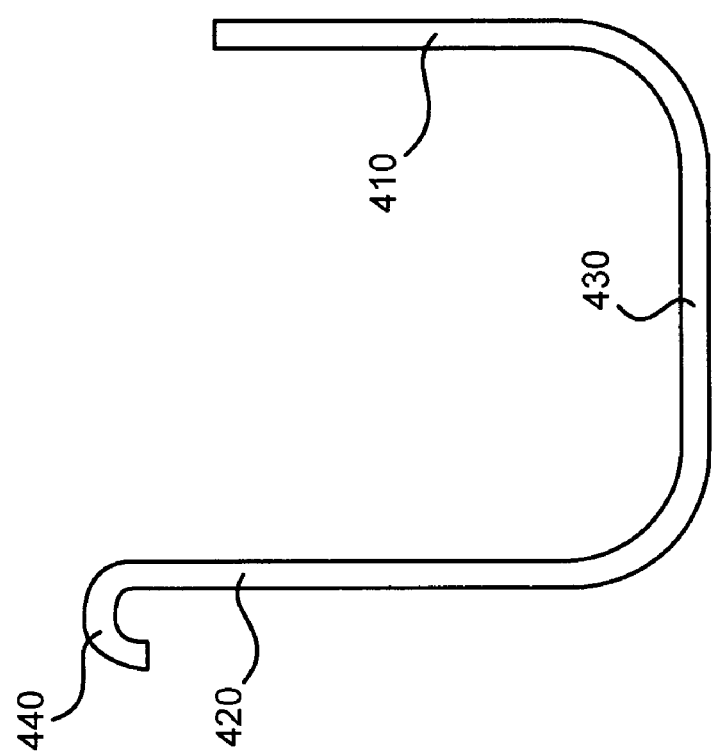
FIG. 4 is a front elevational of an alternative exemplary guide according to an implementation consistent with principles of the invention.

In an implementation consistent with principles of the invention, as shown in FIG. 4, a guide 160A may include a first side portion 410, a second side portion 420, and a base portion 430 which may integrally connect first side portion 410 to second side portion 420. Guide 160A may be similar to guide 160 shown in FIGS. 1, 3A, and 3B (i.e., similar size, materials, etc.), but may be more round in shape and may include a hook 440 integrally provided at the distal end of second side portion 420. Hook 440 may be used to connect guide 160A to PCB 110. For example, hook 440 may be provided in an opening provided in PCB 110 and sized to accommodate hook 440.

Exemplary Processes

Figure 5:
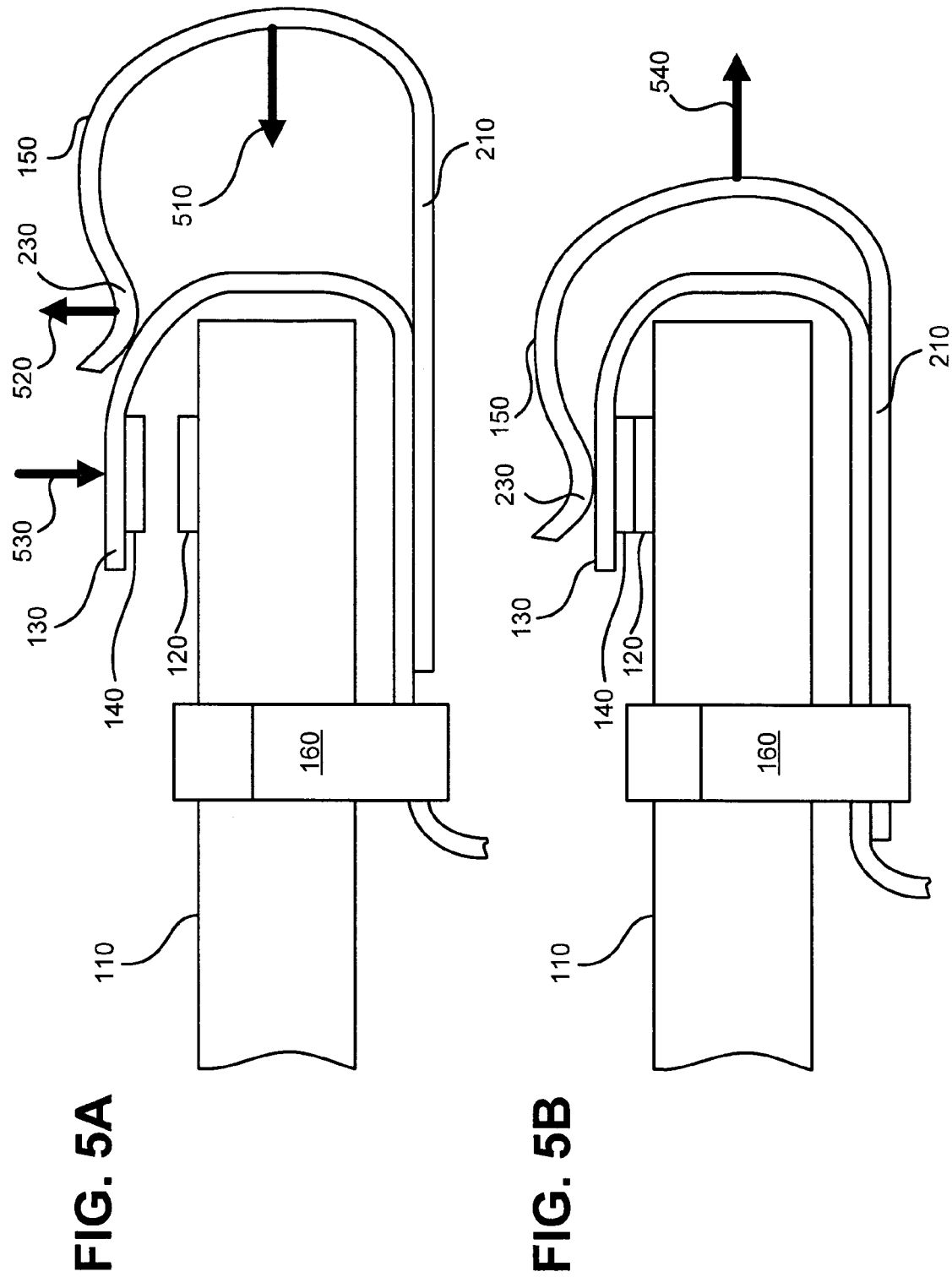
FIG. 5A is a partial side elevational view of the exemplary system of FIG. 1 and further showing the forces being exerted upon the spring clip and flexible circuit when the spring clip is inserted to electrically interconnect the flexible circuit to the PCB, according to an implementation consistent with principles of the invention.
FIG. 5B is a partial side elevational view of the exemplary system of FIG. 1 and further showing the force being exerted upon the spring clip upon removal, according to implementations consistent with principles of the invention.

FIG. 5A is a partial side elevational view of the exemplary system 100 of FIG. 1, and further shows how to assemble system 100. As shown in FIG. 5A, flexible circuit 130 may be folded around an edge of PCB 110 in such a way that contact 140 of flexible circuit 130 may be aligned with contact 120 of PCB 110. A sideways force 510 may be exerted upon spring clip 150 to move spring clip 150 toward PCB 110. An upward force 520 may be exerted upon engagement portion 230 of spring clip 150 to aid in "opening" spring clip 150. Engagement portion 230 of spring clip 150 may exert a downward force 530 upon flexible circuit 130 to force contact 140 of flexible circuit 130 towards contact 120 of PCB 110. Sideways force 510 may be applied until engagement portion 230 is provided over contacts 120 and 140, and spring clip 150 firmly holds contacts 120 and 140 together, as shown in FIG. 5B. When contacts 120 and 140 engage each other, they may electrically interconnect flexible circuit 130 to PCB 110. Contacts 120 and 140 may remain together due to a restraining force imparted by flex portion 220 on engagement portion 230 of spring clip 150. In turn, engagement portion 230 of spring clip 150 may impart a restraining force holding contacts 120 and 140 together. As further shown in FIGS. 5A and 5B, sideways force 510 may cause base portion 210 of spring clip 150 to move towards (and eventually into) guide 160.

As further shown in FIG. 5B, another sideways force 540 may be exerted upon spring clip 150 to move spring clip 150 away from PCB 110, which may permit flexible circuit 130 to be electrically uncoupled from PCB 110. When sideways force 540 moves spring clip 150 far enough away from PCB 110, spring clip 150 may return to its "closed" position, as shown in FIG. 2D.

Figure 6:
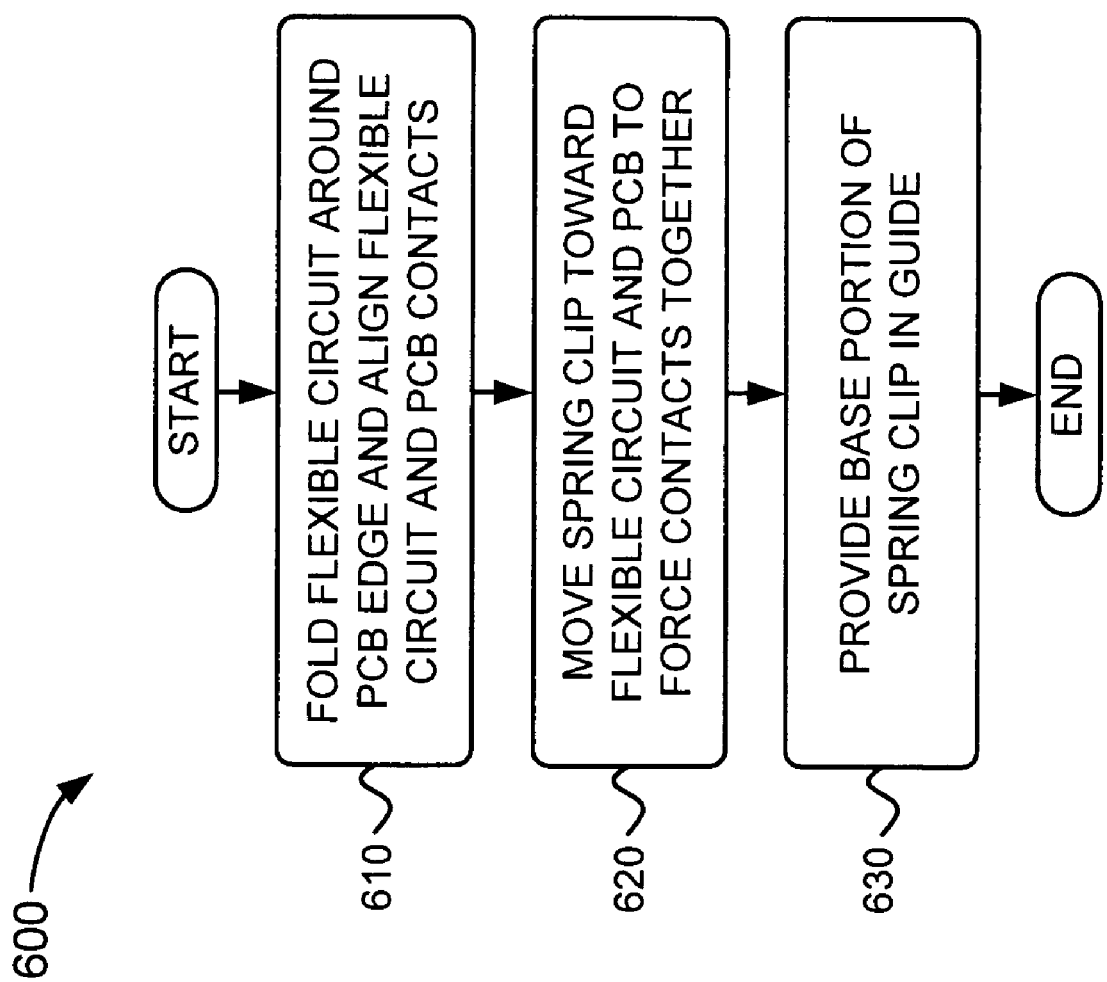
FIG. 6 is a flowchart of an exemplary process according to an implementation consistent with principles of the invention.

FIG. 6 is a flowchart of an exemplary process 600 according to implementations consistent with principles of the invention. As shown in FIG. 6, process 600 may include folding a flexible circuit around an edge of a PCB, and aligning a flexible circuit contact with a PCB contact (block 610). For example, in one implementation described above in connection with FIG. 5A, flexible circuit 130 may be folded around an edge of PCB 110 in such a way that contact 140 of flexible circuit 130 may be aligned with contact 120 of PCB 110.

As further shown in FIG. 6, process 600 may include moving a spring clip toward the flexible circuit and the PCB to force the flexible circuit and PCB contacts together (block 620). For example, in one implementation described above in connection with FIG. 5A, sideways force 510 may be exerted upon spring clip 150 to move spring clip 150 toward PCB 110. Engagement portion 230 of spring clip 150 may exert downward force 530 upon flexible circuit 130 to force contact 140 of flexible circuit 130 towards contact 120 of PCB 110. Sideways force 510 may be applied until engagement portion 230 is provided over contacts 120 and 140, and spring clip 150 firmly holds contacts 120 and 140 together.

Process 600 may include providing a base portion of spring clip in a guide (block 630). For example, in one implementation described above in connection with FIGS. 5A and 5B, sideways force 510 may cause base portion 210 of spring clip 150 to move towards (and eventually into) guide 160.

CONCLUSION

Implementations consistent with principles of the invention may include systems and methods for electrically interconnecting a flexible electrical device (e.g., flexible circuit 130) to a rigid electrical device (e.g., PCB 110) which may be provided in a variety of devices. The systems and methods may provide a quick, easy, and cost-effective way to electrically interconnect the flexible electrical device to the rigid electrical device. In case of device repair and/or modification, the systems and methods may provide an easy way to disconnect the flexible electrical device from the rigid electrical device.

The foregoing description of preferred embodiments of the invention provides illustration and description, but is not intended to be exhaustive or to limit the invention to the precise form disclosed. Modifications and variations are possible in light of the above teachings or may be acquired from practice of the invention. For example, while series of acts have been described with regard to FIGS. 5A, 5B, and 6, the order of the acts may be modified in other implementations consistent with principles of the invention. Further, non-dependent acts may be performed in parallel. Furthermore, although the Figures show the interconnection of a flexible electrical device (e.g., flexible circuit 130) and a rigid electrical device (e.g., PCB 110), the interconnection mechanism (e.g., spring clip 150) may be used to electrically interconnect a flexible electrical device to another flexible electrical device and/or to electrically interconnect a rigid electrical device to another rigid electrical device, according to implementations consistent with principles of the invention.

It should be emphasized that the term "comprises/comprising" when used in the this specification is taken to specify the presence of stated features, integers, steps or components but does not preclude the presence or addition of one or more other features, integers, steps, components or groups thereof.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A system comprising:
   a rigid electrical device including a first contact;
   a flexible electrical device including a second contact;
   a spring clip connecting the first contact to the second contact to electrically interconnect the rigid electrical device to the flexible electrical device; and
   a guide for receiving a portion of the spring clip, where the guide comprises a base portion integrally connecting a first side portion and a second side portion, and where a distal end of one of the first or second side portions includes a hook for removably connecting the guide to the rigid electrical device.

2. The system of claim 1, wherein the guide supports the portion of the spring clip and prevents lateral movement of the portion of the spring clip.

3. The system of claim 1, wherein the rigid electrical device comprises a printed circuit board.

4. The system of claim 1, wherein the flexible electrical device comprises a flexible circuit.

5. The system of claim 1, wherein the spring clip comprises a flex portion integrally connecting a base portion to an engagement portion.

6. The system of claim 5, wherein the engagement portion provides a force to connect the first contact to the second contact.

7. The system of claim 5, wherein the flex portion flexes to open the spring clip for receiving the rigid electrical device and the flexible electrical device.

8. A device comprising:
   a printed circuit board including a first contact;
   a flexible circuit including a second contact;
   a spring clip having a flex portion integrally connecting a base portion to an engagement portion, the flex portion of the spring clip imparting a force to the engagement portion to cause the engagement portion to impart a force connecting the first contact to the second contact and electrically interconnect the printed circuit board to the flexible circuit; and
   a guide for receiving the base portion of the spring clip, where the guide comprises a base portion integrally connecting a first side portion and a second side portion, and where a distal end of one of the first or second side portions includes a hook for removably connecting the guide to the printed circuit board.

9. A system comprising:
   means for providing a rigid support for at least a first contact;
   means for providing a flexible support for at least a second contact;
   means for providing a spring force connecting the first contact to the second contact to electrically interconnect the rigid support to the flexible support; and
   means for receiving a portion of the means for providing a spring force, where the means for receiving comprises a base portion integrally connecting a first side portion and a second side portion, and where a distal end of one of the first or second side portions includes a hook for removably connecting the means for receiving to the means for providing a rigid support.

10. A method comprising:
    folding a flexible electrical device around an edge of a rigid electrical device;
    aligning a flexible electrical device contact with a rigid electrical device contact;
    providing a portion of a spring clip in a guide that comprises a base portion integrally connecting a first side portion and a second side portion, where a distal end of one of the first or second side portions includes a hook for removably connecting the guide to the rigid electrical device;
    preventing lateral movement of the portion of the spring clip with the guide; and
    connecting the flexible electrical device contact to the rigid electrical device contact with the spring clip to electrically interconnect the rigid electrical device to the flexible electrical device.

11. The method of claim 10, further comprising:
    moving the spring clip toward the flexible electrical device and the rigid electrical device to force the flexible electrical device contact into connection with the rigid electrical device contact.

12. The method of claim 10, further comprising:
    moving the spring clip away from the flexible electrical device folded around the edge of the rigid electrical device;
    disconnecting the flexible electrical device contact from the rigid electrical device contact by releasing a force exerted by the spring clip on the contacts; and
    unfolding the flexible electrical device from the edge of the rigid electrical device.

* * * * *